United States Patent
Clarke et al.

(10) Patent No.: US 7,225,417 B2
(45) Date of Patent: May 29, 2007

(54) METHOD AND SYSTEM TO VERIFY A CIRCUIT DESIGN BY VERIFYING CONSISTENCY BETWEEN TWO DIFFERENT LANGUAGE REPRESENTATIONS OF A CIRCUIT DESIGN

(75) Inventors: Edmund M. Clarke, Mt. Lebanaon, PA (US); Daniel Kroening, Pittsburgh, PA (US); Karen Yorav, Haifa (IL)

(73) Assignee: Carnegie Mellon University, Pittsburgh, PA (US)

( * ) Notice: Subject to any disclaimer, the term of this patent is extended or adjusted under 35 U.S.C. 154(b) by 347 days.

(21) Appl. No.: 10/708,056

(22) Filed: Feb. 5, 2004

(65) Prior Publication Data

US 2005/0071147 A1    Mar. 31, 2005

Related U.S. Application Data

(60) Provisional application No. 60/506,660, filed on Sep. 26, 2003.

(51) Int. Cl.
    *G06F 17/50*    (2006.01)
(52) U.S. Cl. .............................................. 716/5; 716/4
(58) Field of Classification Search .................. 716/1, 716/4–5, 18; 702/22; 714/33; 703/2
    See application file for complete search history.

(56) References Cited

U.S. PATENT DOCUMENTS

| | | | |
|---|---|---|---|
| 6,131,078 A | 10/2000 | Plaisted | |
| 6,904,578 B2* | 6/2005 | Jain et al. ....................... | 716/5 |
| 7,047,139 B2* | 5/2006 | Shtrichman .................. | 702/22 |
| 2004/0019468 A1* | 1/2004 | De Moura et al. .............. | 703/2 |
| 2004/0078674 A1* | 4/2004 | Raimi et al. ................... | 714/33 |

OTHER PUBLICATIONS

Clarke et al., "Hardware Verificaiton Using ANSI-C Programs as a Reference," DAC, Jan. 2003, pp. 308-311.*
Biere et al., "SAT and ATPG: Boolean Engines for Formal Hardware Verificatioin," IEEE, Feb. 2002, pp. 782-784.*
Clarke et al., "Behavioral Consistency of C ADN Verilog Programs Using Bounded Model Checking," DAC,, Jun. 2003.*
Cabodi et al., "Can BDDs Compete With SAT Solvers on Bounded Model Checking", DAC, Jun. 2002, pp. 117-122.*
Carl Pixley, Guest Editor's Introduction: Formal Verification of Commercial Integrated Circuits. IEEE Design & Test of Computers, 18(4):4-5, 2001.
Armin Biere, Alessandro Cimatti, Edmund M. Clarke, and Yunshan Yhu. Symbolic model checking without BDDs. In Tools and Algorithms for Construction and Analysis of Systems, pp. 193-207, 1999.
A. Biere, E. Clarke, R. Raimi, and Y. Zhu. Verifying safety properties of a Power PC™ microprocessor using symbolic model checking without B DDs. In N. Halbwachs and D. Peled, editors, Proceedings of the 11th International Conference on Computer Aided Verification (CAB 99), Lecture Notes in Computer Science. Springer Verlag, 1999.

(Continued)

*Primary Examiner*—Vuthe Siek
(74) *Attorney, Agent, or Firm*—Charles L. Moore; Moore & Van Allen PLLC (57) ABSTRACT

A method to verify a circuit design may include applying a bounded model checking technique to a first computer language representation of the circuit design and to a second computer language representation of the circuit design. The method may also include determining a behavioral consistency between the first and second computer language representations.

39 Claims, 7 Drawing Sheets

OTHER PUBLICATIONS

A. Biere, A. Cimatti, E.M. Clarke, M. Fujita, and Y. Zhu. Symbolic model checking using SAT procedures instead of BDDs. In Design Automation Conference (DAC '99), 1999.

Joao P. Marques-Silva and Karem A. Sakallah. GRASP—A New Search Algorithm for Satisfiability. In Proceedings of IEEE/ACM International Conference on Computer-Aided Design, pp. 220-227, Nov. 1996.

D. Kroening and O. Strichman. Efficient computation of recurrence diameters. In Proceedings of the Fourth International Conference on Verification, Model Checking and Abstract Interpretation. Springer, 2003. To appear.

O. Shtrichman. Tuning SAT checkers for bounded model checking. In E.A. Emerson and A.P. Sistla, editors, Proceedings of the $12^{th}$ International Conference on Computer Aided Verification (CAV 2000), Lecture Notes in Computer Science. Springer Verlag, 2000.

Fady Copty, Limor Fix, Ranan Fraer, Enrico Giunchiglia, Gila Kamhi, Armando Tacchella, and Moshe Y. Vardi. Benefits of bounded model checking at an industrial setting. In Gerard Barry, Hubert Comon, and Alain Finkel, editors, Proceedings of the $13^{th}$ International Conference on Computer Aided Verification (CAV 2001), No. 2102 in Lecture Notes in Computer Science, pp. 436-453. Springer-Verlag, 2001.

Per Bjesse, Tim Leonard, and Abdel Mokkedem. Finding bugs in an Alpha microprocessor using satisfiability solvers. In Gerard Berry, Hubert Comon, and Alain Finkel, editors, Proceedings of the $13^{th}$ International Conference on Computer Aided Verification (CAV 2001), No. 2102 in Lecture Notes in Computer Science, pp. 454-464. Springer Verlad, 2001.

Luc Semeria, Andrew Seawright, Renu Mehra, Daniel Ng, Arjuna Ekanayaka, and Barry Pangrle. RTL C-based methodology for designing and verifying a multi-threaded processor. In Proc. Of the $39^{th}$ Design Automation Conference ACM Press, 2002.

I. Page. Constructing Hardware-Software Systems from a Single Description. Journal of VLSI Signal Processing, 1291):87-107, 1996.

A. Pnueli, M. Siegel, and O. Shtrichman. The code validation tool (CVT)—automatic verification of a compilation process. Int. Journal of Software Tools for Technology Transfer (STTT), 2(2):192-201, 1998.

R. Cytron, J. Ferrante, B.K. Rosen, M.N. Wegman, and F.K. Zadeck. An efficient method of computing static single assignment form. In Proceedings of the $16^{th}$ ACM SIGPLAN-SIGACT symposium on Principles of programming languages, pp. 25-35. ACM Press, 1989.

David W. Currie, Alan J. Hu, and Sreeranga Rajan. Automatic formal verification of dsp software. In Proceedings of the $37^{th}$ Design Automation Conference (DAC 2000), pp. 130-135. ACM Press, 2000.

Kiyoharu Hamaguchi. Symbolic simulation heuristics for high-level design descriptions with uninterpreted functions. In International Workshop on High-Level Design, Validation, and Test, pp. 25-30. IEEE, 2001.

C. Blank, H. Eveking, J. Levihn, and G. Ritter. Symbolic simulation techniques—state of the art and applications. In International Workshop on High-Level Design, Validation, and Test, pp. 45-50. IEEE, 2001.

Clarke, Edmund M. Jr., et al., Model Checking, (1999) United States, 33 pages.

\* cited by examiner

METHOD AND SYSTEM TO VERIFY A CIRCUIT DESIGN BY VERIFYING CONSISTENCY BETWEEN TWO DIFFERENT LANGUAGE REPRESENTATIONS OF A CIRCUIT DESIGN

CROSS REFERENCE TO RELATED APPLICATIONS

This application is related to U.S. provisional application No. 60/506,660, filed Sep. 26, 2003, entitled METHOD AND SYSTEM TO VERIFY A CIRCUIT DESIGN naming Edmund M. Clarke, Daniel Kroening and Karen Yorav, as the inventors. The contents of the provisional application are incorporated herein by reference in their entirety, and the benefit of the filing date of the provisional application is hereby claimed for all purposes that are legally served by such claim for the benefit of the filing date.

BACKGROUND OF INVENTION

The present invention relates to verifying designs of electronic or digital circuits or the like, and more particularly to a method and system to verify a representation of a circuit design in one computer language, such as a hardware design language (HDL), against another representation of the circuit design in another language, such as C or the like.

When a new device, such as an electronic or digital circuit or the like, is designed, a "golden model" or simulation model may be written in a programming language, such as ANSI-C or a similar programming language. This model together with any embedded software that may run on the device is typically extensively simulated and tested to insure both correct functionality and performance. The device is also typically simulated in a hardware description language (HDL), such as Verilog® or the like. Testing and simulating the circuit in a programming language such as C is easier and faster compared to an HDL language; although, the HDL representation may be used to generate the actual circuit or commercial product. Rather than performing extensive testing on the HDL representation, the product development cycle can be much more efficient using the programming language representation for testing. However, consistency between the programming language model or representation and the HDL model or representation with respect to inputs and outputs must be verified to insure that the models or representations are viable tools and provide accurate results in simulating and testing the new device or circuit. Previous methods of verification can involve complex operations and provide inaccurate results.

SUMMARY OF INVENTION

In accordance with an embodiment of the present invention, a method to verify a device or circuit design may include applying a bounded model checking technique to a first computer language representation of the device or circuit design and to a second computer language representation of the device or circuit design. The method may also include determining a behavioral consistency between the first and second computer language representations.

In accordance with another embodiment of the present invention, a method to verify a circuit may include finding a loop and replacing the loop by an unwinding assertion in response to an unwinding limit for the loop being exceeded. The method may also include duplicating a loop body in response to an unwinding limit for the loop being less than a predetermined limit.

In accordance with another embodiment of the present invention, a system to verify a device or circuit design may include a processor adapted to apply a bounded model checking technique to a first computer language representation of the device or circuit design and to a second computer language representation of the device or circuit design. The system may also include a software program to determine a behavioral consistency between the first and second computer language representations.

In accordance with another embodiment of the present invention, a computer-readable medium having computer-executable instructions for performing a method that may include applying a bounded model checking technique to a first computer language representation of the circuit design and to a second computer language representation of the circuit design. The method may also include determining a behavioral consistency between the first and second computer language representations.

DETAILED DESCRIPTION

The following detailed description of preferred embodiments refers to the accompanying drawings which illustrate specific embodiments of the invention. Other embodiments having different structures and operations do not depart from the scope of the present invention.

Figure 1A:
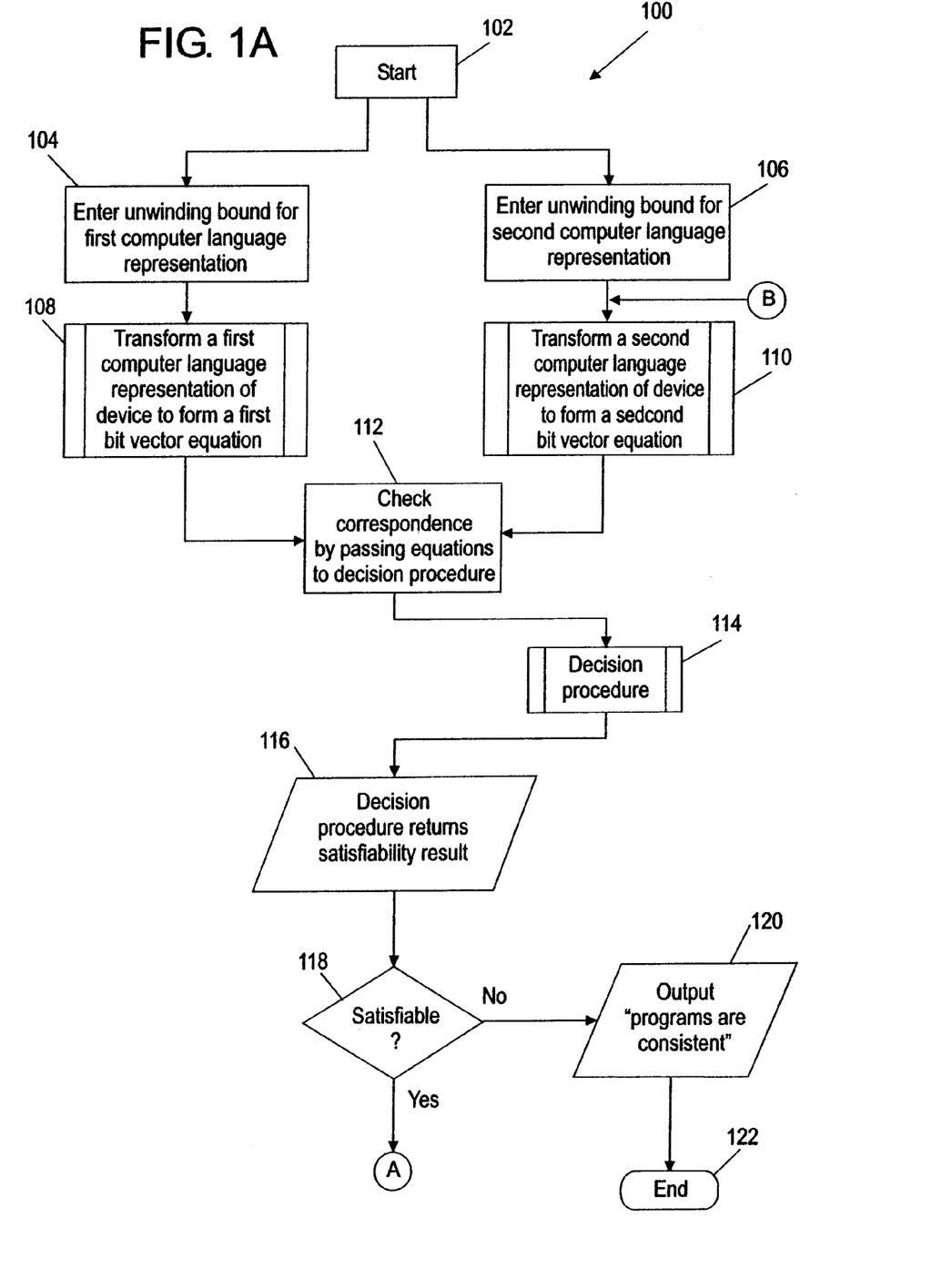
FIGS. 1A and 1B (collectively FIG. 1) are a flow chart of a method to verify a device in accordance with an embodiment of the present invention.
Figure 1B:
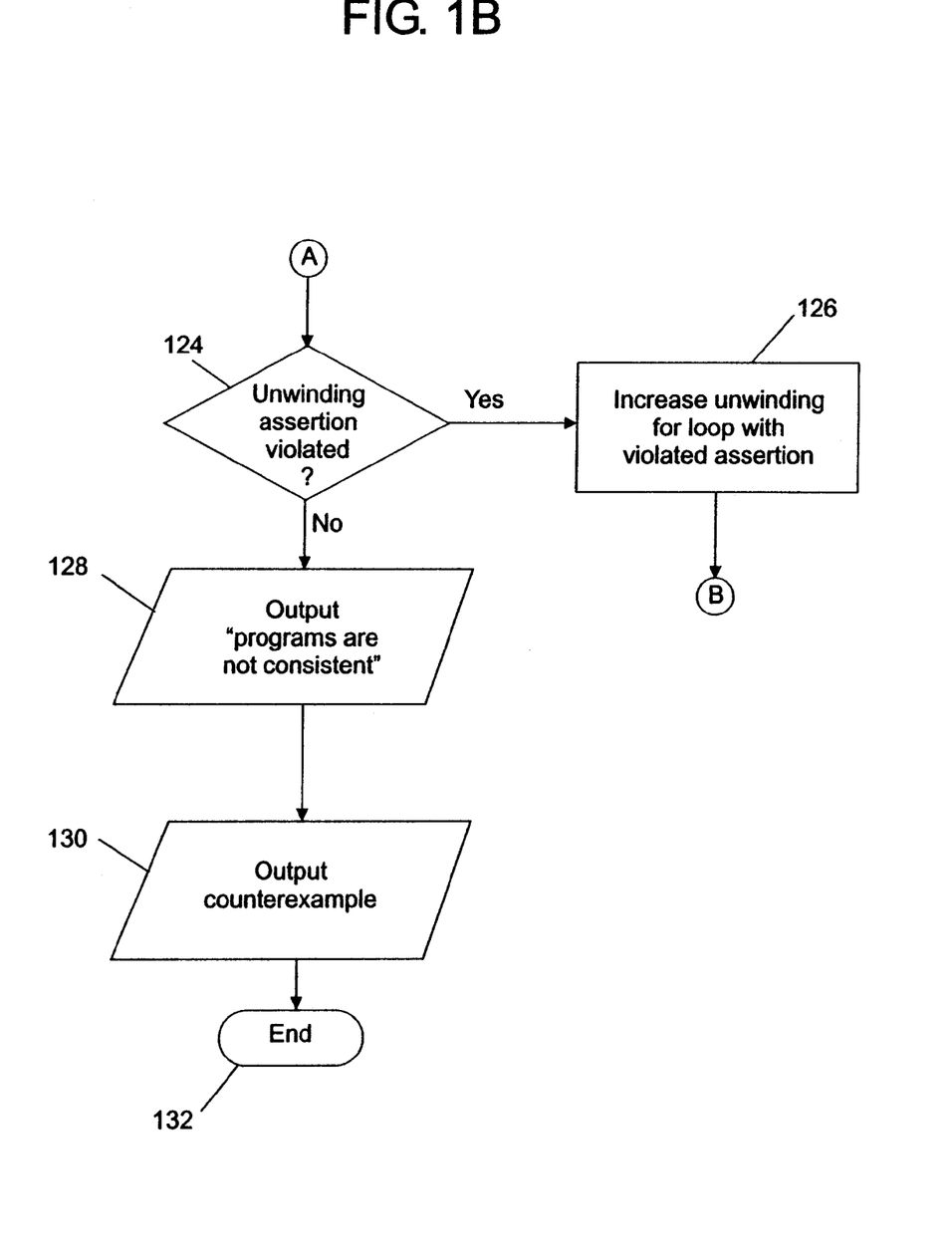

FIGS. 1A and 1B are a flow chart of a method 100 to verify a device, circuit design or the like in accordance with an embodiment of the present invention. The method 100 may start at block 102. In block 104, an unwinding bound or unwinding bound parameter for a first computer language representation of the device or circuit design may be entered. The unwinding bound may be entered by a user into a command line via an input device, such as a keyboard or the similar input device. The command line may be generated by the method 100 and displayed on a display or a monitor of a system, such as a system 600 of FIG. 6. Alternatively, the unwinding bound may be entered via an interactive input or the like. The first computer language representation of the device or circuit may be a hardware description language (HDL) representation, such as Verilog® or the like.

In block 106, an unwinding bound may be entered by a user for a second computer language representation of the device or circuit design. The unwinding bound may also be entered into a command line or by an interactive input. The second computer language representation may be a program language, such as a C-type language or other type programming language. In contrast to the unwinding bound for a HDL or Verilog® representation of a device, there may be multiple inputs or bounds for a programming language because there may be multiple loops in a program language or C-type program representation of a device or circuit design. Entering an unwinding bound for the second computer representation or program language representation may be optional in at least one embodiment in that the method 100 may be adapted to automatically increase an unwinding depth if necessary.

In block 108, the first computer language representation of the device or HDL representation may be transformed to form a bit vector equation. An example of a method to transform the first computer language representation or HDL representation to form a bit vector equation by a process known as unwinding loops of the representation or program will be described in more detail with reference to FIG. 2. In block 110, the second computer language representation of the device or program language representation may be transformed to form a second bit vector equation. An example of a method to transform the second computer language representation or program language representation by unwinding to form a bit vector equation will be described in more detail with reference to FIG. 3. The first and second computer language representations may be transformed or unwound in tandem.

In block 112, a correspondence between the two bit vector equations may be checked or determined by conjoining the equations and passing them to a decision procedure 114 that may use a SAT procedure or a similar decision procedure. The decision procedure 114 will return a satisfyability result in block 116. An example of a decision procedure that may use a SAT procedure or the like in accordance with an embodiment of the present invention will be described in more detail with respect to FIG. 5. The decision procedure 114 may return whether the conjoined equation is satisfiable or not. That is, whether there exists an assignment to the variables within the equation that makes the equation "true." If the equation is not satisfiable in block 118, the method 100 may advance to block 120 and no violation of any claim was found in the decision procedure 114. Thus, no mismatch exists between the first or HDL representation of the device and the second or program language representation of the device within the unwinding depth entered by the user. The method 100 may output a "Programs are Consistent" message or indication that may be displayed or presented on an output device of a system such as system 600 to be described with reference to FIG. 6. The method may then end at termination 122.

If the equation is found to be satisfiable in the decision procedure 114 and block 118, the method 100 may advance to block 124 (FIG. 1B). If the equation is satisfiable, a violation of a claim or assertion was found. There may be three types of claims or assertions. A first type of claims are claims that assert the correspondence between the first or HDL representation and the second or program language representation. These claims may be referred to as correspondence assertions. A second type of claims are claims that make assertions about the standard of conformity of the program language or C program representation of the device. A third type of claims are unwinding assertion type claims. A satisfying assignment provided by the decision process 114 contains the information of exactly which claim or assertion is violated. If the claim violated is determined to be an unwinding assertion in decision block 124, the method 100 may advance to block 126. There may be separate unwinding assertions for each loop and each loop instance of a programming language representation, such as C. Unwinding assertions may be generated as part of the algorithm or method 100. When converting assertions into an equation, the assertions are conjoined to build a bit-vector equation. The equation is then converted into a conjunctive normal form (CNF), as described in more detail herein. One variable (vi) is introduced for each claim or assertion (pi) during conversion into CNF. When a SAT solver returns with a satisfying assignment, the satisfying assignment provides a value for each of the variables (v1–vn). In order to be a satisfying assignment, at least one of the claims must be violated, and thus, at least one of the variables must be zero or false. The one variable (vi) that is zero corresponds to a particular assertion (pi). Accordingly, if v10 is zero, then assertion p10 is violated. Once the assertion that is violated is known, the loop to which the assertion belongs is also known and the unwinding for the loop with the violated assertion may be increased as indicated in block 126. The method 100 may then return to block 110 (FIG. 1A) to further unwind the particular loop. The number of times a loop may be unwound may be increased using some heuristic, such as by increasing by one or by a user providing a percentage. The unwinding procedure may be terminated in response to a completeness threshold of a potential counterexample being exceeded.

If a determination is made in block 124 that an unwinding assertion has not been violated, the method may advance to block 128. Under these circumstances, an assertion which is not an unwinding assertion was found to be violated. The method 100 may output this information to the user and a "Programs are not Consistent" message, signal or the like may be presented or displayed to the user as an output. The location, file name and line number, of the violated assertion may also be displayed or presented to the user as an output. In block 130, a counterexample may be outputted to the user. The satisfying assignment provided by the decision procedure contains a value for each variable in the equation. The equation contains a variable for the value of each assignment made by the method 100 or decision procedure 114. Additionally, the equation contains a variable for each control flow guard or the value that is the argument of "if" statements. This allows a counterexample trace to be provided or printed. The counterexample may be helpful to the user in identifying a cause of the problem or inconsistency. The method 100 may then end at termination 132.

Figure 2:
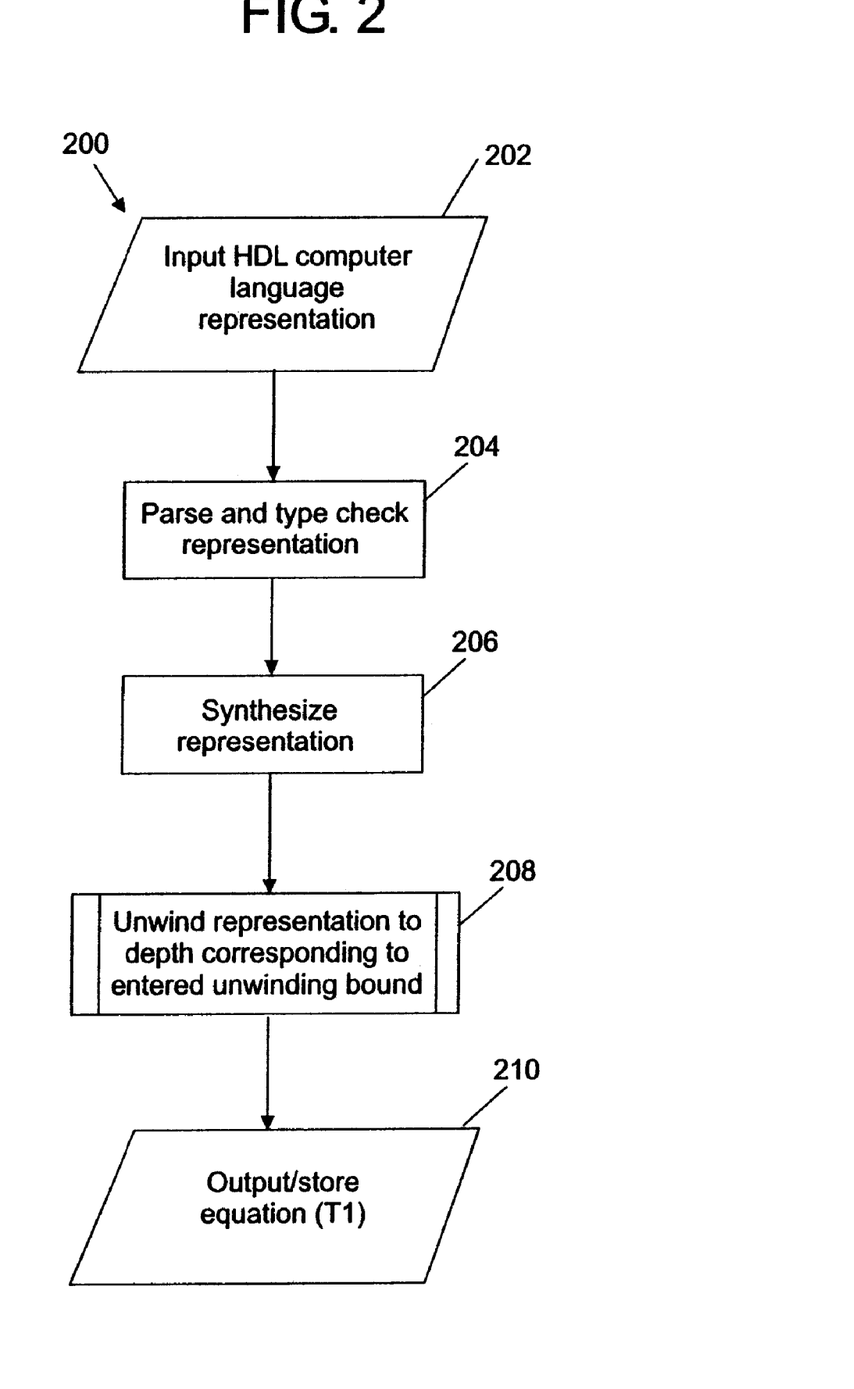
FIG. 2 is a flow chart of a method to transform a HDL computer language representation or the like of a device in accordance with one embodiment of the present invention

FIG. 2 is a flow chart of a method 200 to transform a computer language representation of a device in accordance with one embodiment of the present invention. The method 200 is an example of a method that may be used to transform a first computer language or HDL representation of a device to form a first bit vector equation in block 108 of the method 100 of FIG. 1. In block 202, a computer language representation, HDL representation or the like of a device or circuit design may be inputted, read or retrieved from a data source, such as a user-specified source or file. In block 204, the file or representation may be parsed and checked for type consistency. This operation may be similar to that performed by any circuit synthesis tool. The parsing and checking type consistency may be dependent upon the HDL. For example, the hardware description may be separated into components and checked for typing errors or the like. In block 206, the representation or circuit description may be synthesized into a register transfer level (RTL) description. This operation or function may be similar to such operations performed by industry standard synthesis tools. Optionally, this operation may preserve non-determinism if contained in the circuit description. In block 208, the representation of the circuit or device may be unwound up to a predetermined depth that may be selected by user, such as in block 104 of FIG. 1. The unwinding operation may be performed using a bounded model checking technique. In block 210, an equation, such as a bit vector equation, resulting from the unwinding operation may be stored in a data source, for example as a file. An example of how to perform bounded model checking on a circuit is described in "Symbolic Model Checking Using SAT Procedures Instead of BDDs," by A. Biere, A. Cimatti, E. Clarke, M. Fujita and Y. Zhu, *Proceedings: Design Automation Conference* (DAC 99), New Orleans, La., pp. 317–320 (1999) which is incorporated herein by reference.

Figure 3:
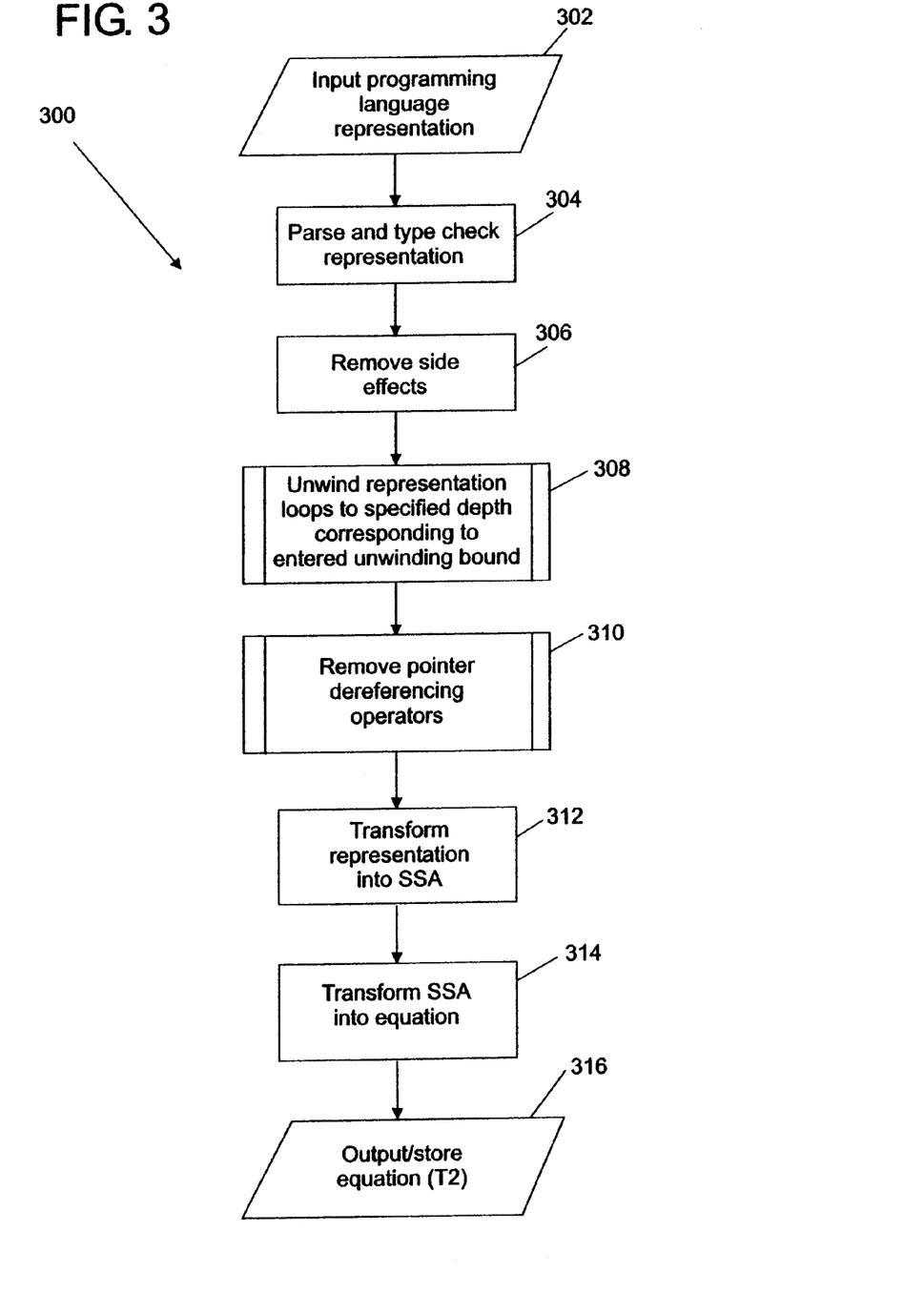
FIG. 3 is a flow chart of a method to transform a programming language representation or the like of a device in accordance with another embodiment of the present invention.

FIG. 3 is a flow chart of a method 300 to transform a computer language representation or programming language representation, such as a C-type language or the like, of a device or circuit design in accordance with another embodiment of the present invention. In block 302, the computer language or program language representation of the device or circuit design may be inputted, loaded or read from a data source, such as a file, that may be specified by the user. In block 304, the representation may be parsed and checked for type consistency. This operation or function may be similar to that performed by an ANSI-C compiler or the like. In block 306, side effects in the representation or program may be removed by inlining functions and expanding prefix and postfix operators and compound assignment operators. In block 308, the representation may be unwound to a specified or predetermined depth corresponding to an unwinding bound entered by a user, such as in block 106 of FIG. 1. In one embodiment of the present invention the unwinding bound may be incremented similar to that represented by block 126 in FIG. 1. An example of a process for unwinding a representation will be described in more detail with reference to FIG. 4. In block 310, pointer dereferencing operators may be removed. In block 312, the representation or program may be transformed into a static single assignment (SSA) form. A method of computing a SSA form is described in "An Efficient Method of Computing Static Single Assignment Form," by R. Cytron, J. Ferrante, B. K. Rosen, M. N. Wegman and F. K. Zadeck, *Proceedings of the 16th ACM SIGPLAN-SIGACT Symposium on Principles of Programming Languages*, pp. 25–35 (ACM Press 1989) which is incorporated herein by reference. In block 314, the SSA program or representation may be transformed into an equation, such as a bit vector equation. In block 316, the equation may be outputted or stored in a data source as a file. The equation may be designated as T2 for purposes of explaining one embodiment of the invention.

Figure 4:
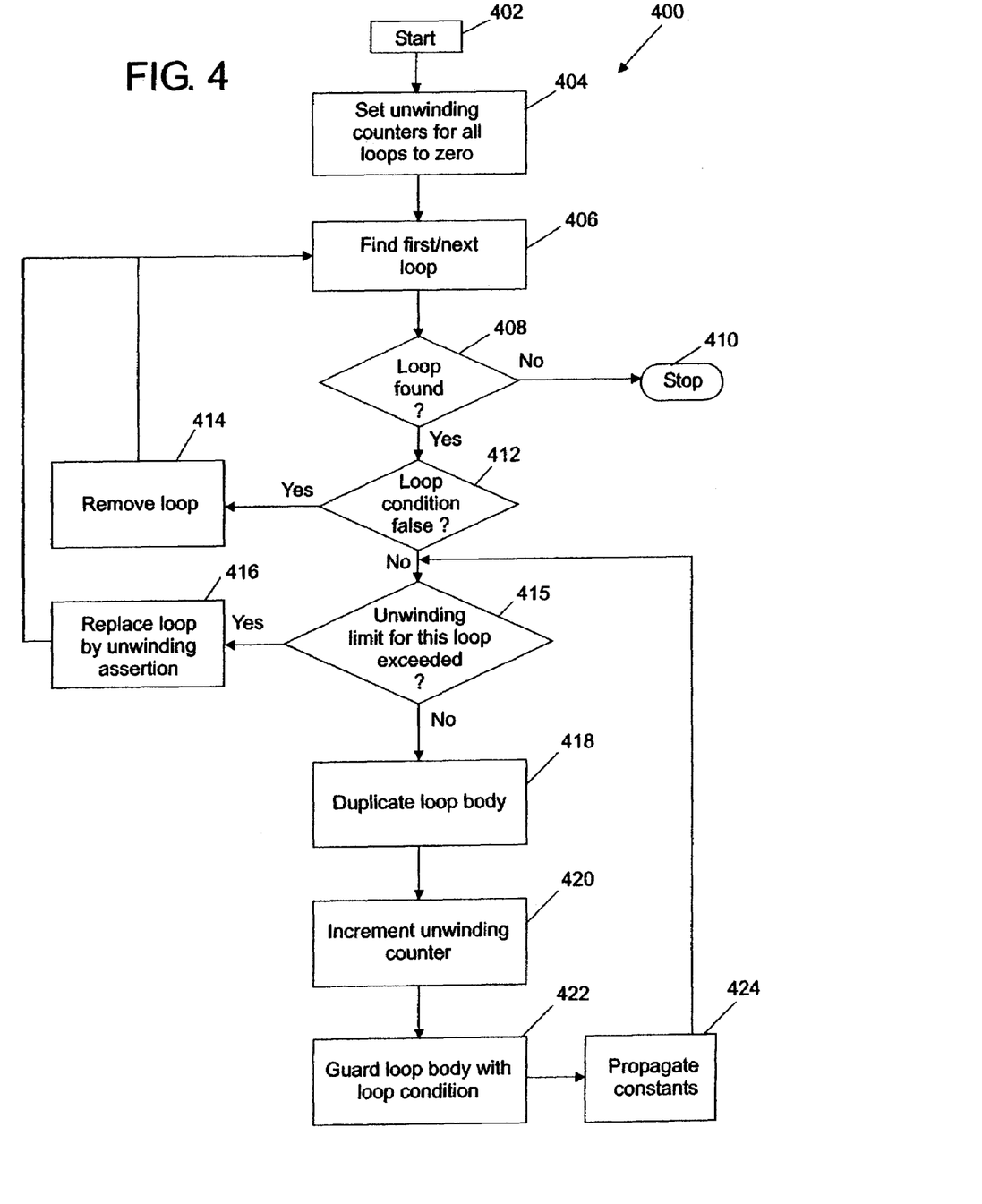
FIG. 4 is a flow chart of a method of unwinding a program or computer language representation of a device in accordance with an embodiment of the present invention.

FIG. 4 is a flow chart of a method 400 of unwinding a program or computer language representation of a device or circuit design in accordance with an embodiment of the present invention. The method 400 is an example of an unwinding process that may be used for the unwinding process in block 308 of FIG. 3. The method may start at block 402. Each loop of a program or representation may be associated with a counter for unwinding purposes. The counter may be referred to as an unwinding counter. In block 404, each unwinding counter for all loops may be set to zero. In block 406, a first loop with respect to execution order, not textual order, of the program may be identified or found. Finding the first loop or next loop is a syntactical search for the loop construct keywords. In block 408, a determination may be made if a loop is found or exists in the program. If no loop is found, the method 400 may be stopped at termination 410. If a loop is found, the method 400 may advance to decision block 412. The loop identified in block 406 may have a loop condition. In block 412, if the loop condition is syntactically equal to "FALSE" (or zero), the method 400 may advance to block 414. In block 414, the loop may be removed from the program or representation along with the whole loop body. From block 414, the method 400 may return to block 406 where a next loop in the execution order may be identified or found and the method 400 may proceed as previously described.

If the loop condition in block 412 is anything other than "FALSE," the method 400 may advance to decision block 415. As previously described with respect to blocks 106 and 126 in FIG. 1, each loop may have an unwinding limit and unwinding counter (block 404). If the loop counter is greater than or equal to the unwinding limit in block 415, the method 400 may advance to block 416. In block 416, the loop, including the loop body, may be replaced by an unwinding assertion. The unwinding assertion is an assertion that takes the negated loop condition as an argument.

If the unwinding limit is not exceeded in block 415, the method 400 may advance to block 418. In block 418, the loop body may be duplicated. The loop body may be copied prior to the beginning of the loop. In block 420, the unwinding counter may be incremented or increased by one. In block 422, both the copy of the loop body and the loop itself may be guarded using an "if" statement that may use the loop condition as a branching condition. In block 424, any constant variable values may be propagated through the copy of the loop body up to the loop condition but may not include the loop condition. If possible, expressions involving constants may be simplified. The simplification may be performed similar to the simplification process performed by a compiler, such as a C compiler. The propagated constants may be returned to decision block 415.

Figure 5:
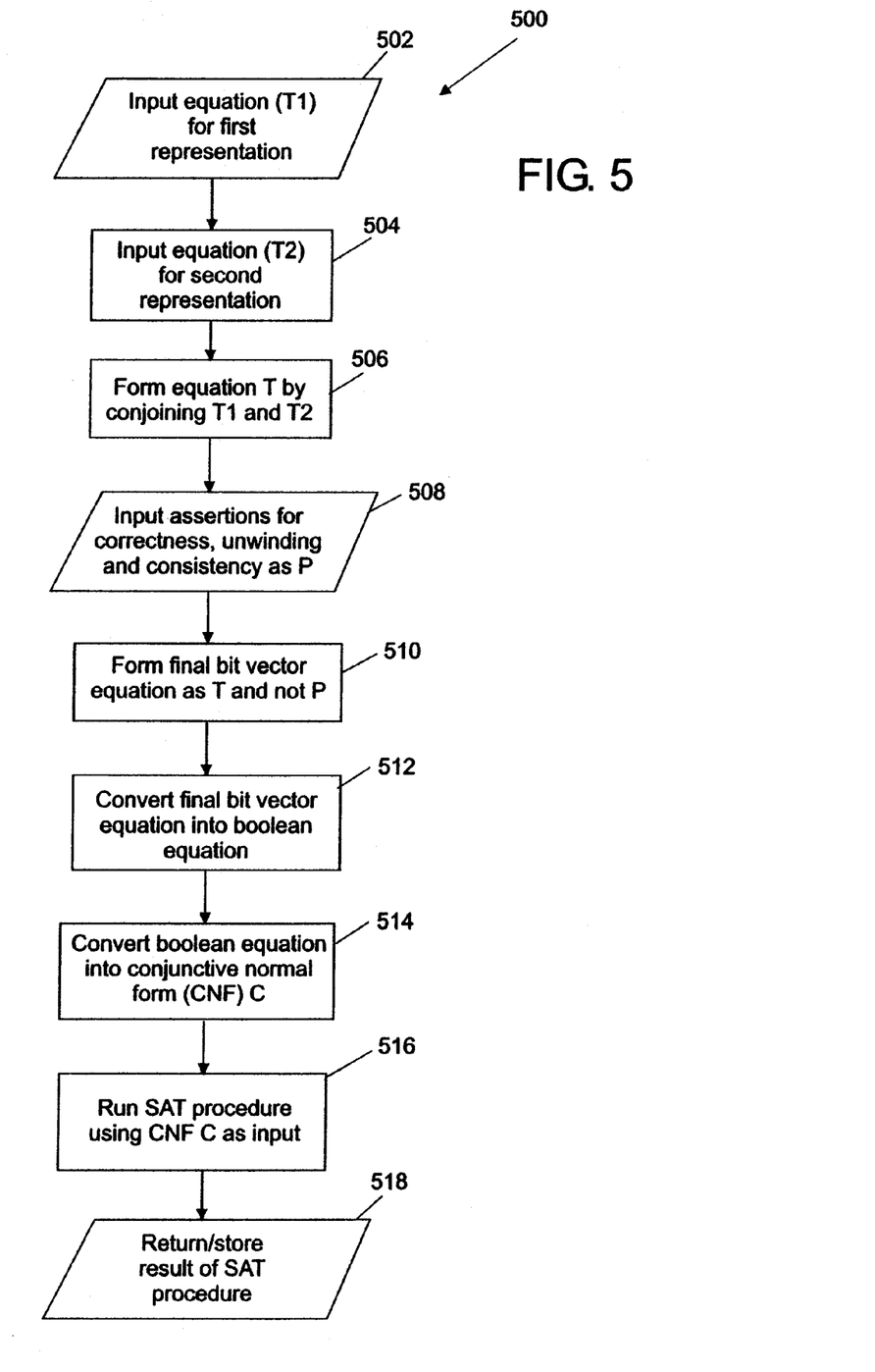
FIG. 5 is a flow chart of a decision procedure in accordance with an embodiment of the present invention.

FIG. 5 is a flow chart of an example of a decision procedure or method 500 in accordance with an embodiment of the present invention. The decision procedure 500 may be used for the decision procedure 114 in FIG. 1. In block 502 an equation, such as T1 from block 210 of FIG. 2, for a first representation or HDL representation of a device or circuit design may be inputted or read into a memory, such as a memory of a system 600 in FIG. 6. In block 504, an equation, such as T2 from block 316 of FIG. 3, for a second representation or programming language representation of a device or circuit design may be inputted or read into a memory. In block 506, the two equations T1 and T2 may be conjoined to form an equation that may be designated "T". T may equal T1 AND T2 or T1 logically "anded" with T2. In block 508, assertions for correctness, unwinding and consistency may be entered or read in to the process. The conjunction of these assertions may be designated "P". In block 510, the final bit vector equation may be formed as T AND NOT P or logically applying equation T to a normal input of a logic AND gate and P to a NOT or inverting input of the logic AND gate. In block 512, the final bit vector equation may be converted into a Boolean equation by flattening the bit vector operators or converting them to Boolean operators. In block 514, the Boolean equation may be converted into a conjunctive normal form (CNF) C. In block 516, a SAT procedure or satisfiability procedure may be run or performed using the CNF C as an input. Examples of the SAT procedure may be "GRASP" or "Chaff." The GRASP SAT procedure is described in "GRASP—A New Search Algorithm for Satisfiability" by Joao P. Marques-Silva and Karem A. Sakallah in *Proceedings of IEEE/ACM International Conference on Computer-Aided Design*, pages 220–227, November 1996, which is incorporated herein in its entirety by reference. Chaff is described in "Chaff: Engineering an Efficient SAT Solver" by Matthew W. Moskewicz, Conor F. Madigan, Ying Zhao, Lintao Zhang and Sharad Makik in *Proceedings of the 38th Design Automation Conference (DAC '01)*, June 2001, which is incorporated herein in its entirety by reference. An example of how to use a SAT procedure for verification is described in U.S. Pat. No. 6,131,078 which is incorporated herein in its entirety by reference.

In block 518, the result of the SAT procedure may be returned and stored or recorded in a data source. The result can be one of "SATISFIABLE" or "UNSATISFIABLE." The result may the satisfiability result returned in block 116 of FIG. 1. If the SAT procedure returns SATISFIABLE, the procedure may also provide a satisfying assignment to demonstrate that the equation is actually satisfiable.

Figure 6:
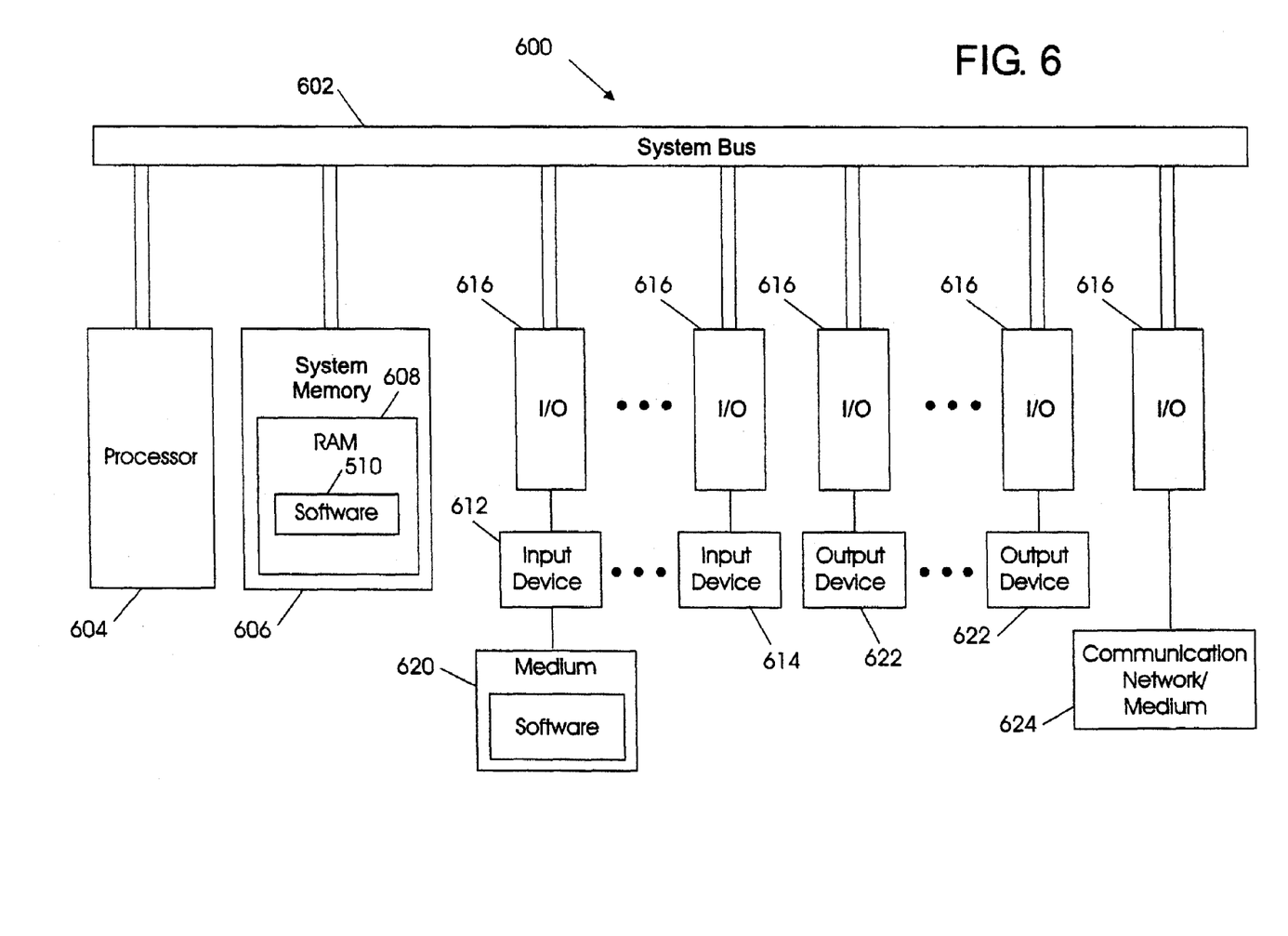
FIG. 6 is a block diagram of an example of a system adapted to verify a device in accordance with an embodiment of the present invention.

FIG. 6 is a block diagram of an example of a system 600 adapted to verify a device in accordance with an embodiment of the present invention. The methods 100, 200, 300, 400 and 500 may be implemented or embodied in the system 600. The method 600 may include a system bus 602. The system 600 may also include a processor 604 that may be coupled to the system bus 604. A system memory 606 may also be coupled to the system bus 602. The system memory 606 may include a random access memory (RAM) 608 or the like to store software 610. The methods 100–500 may be embodied as software, computer-usable or computer-executable instructions stored in the system memory 606. One or more input devices 612 and 614 may also be coupled to the system bus 602 via an input/output interface 616 or the like. The input devices 612 may be an optical, magnetic, infrared, voice recognition or radio frequency input device or the like. The input devices 612 may receive, read or download software or the like, such as software embodying the methods 100–500, from a medium 620. Examples for the medium 620 may be or form part of a communication channel, memory or similar devices. The medium 620 may be any medium that may contain, store, communicate or transport the data embodied thereon for use by or in connection with the input device 612 or system 600. The medium 620 may, for example, be an electronic, magnetic, optical, electromagnetic, infrared or semiconductor system or the like. The medium 620 may also be simply a stream of information being retrieved when the data is "downloaded" through a network such as the Internet or a private network. The input devices 614 may be a keyboard, pointing device or the like.

One or more output devices 622 may also be coupled to the system bus 602 via an I/O interface 616 or the like. The output devices 622 may include a display or monitor, printer, audio system or the like. The system 600 may also be coupled to a communication network or medium 624. The communication medium or network 624 may be coupled to the system bus 602 via an I/O interface 616 or the like. The communication network or medium 624 may be any communication system including by way of example, dedicated communication lines, telephone networks, wireless data transmission systems, two-way cable systems, customized computer networks, interactive kiosk networks, the Internet and the like.

Elements of the present invention, such as methods 100, 200, 300, 400 and 500 may be embodied in hardware and/or software as a computer program code that may include firmware, resident software, microcode or the like. Additionally, elements of the invention may take the form of a computer program product on a computer-usable or computer-readable storage medium having computer-usable or computer-readable program code embodied in the medium for use by or in connection with a system, such as system 600 of FIG. 6. Examples of such a medium may be illustrated in FIG. 6 as input devices 612 or medium 620. A computer-usable or readable medium may be any medium that may contain, store, communicate or transport the program for use by or in connection with a system. The medium, for example, may be an electronic, magnetic, optical, electromagnetic, infrared or semiconductor system or the like. The medium may also be simply a stream of information being retrieved when the computer program product is "downloaded" through a network such as the Internet. The computer-usable or readable medium could also be paper or another suitable medium upon which the program may be printed.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A method to verify a circuit design, comprising:
    forming a first bit vector equation in response to unwinding a representation of the circuit design written in a first computer language;
    forming a second bit vector equation in response to unwinding another representation of the circuit design written in a second computer language;
    comparing the bit vector equations; and
    outputting an indication whether the bit vector equations are consistent.

2. The method of claim 1, further comprising:
    conjoining the first and second bit vector equations to form a conjoined equation; and
    passing the conjoined equation to a decision procedure to determine whether the conjoined equation is satisfiable by an assignment of variables within the conjoined equation that makes the equation true.

3. The method of claim 2, further comprising outputting an indication that the circuit design written in the first computer language is consistent with the circuit design written in the second computer language in response to the conjoined equation not being satisfiable.

4. The method of claim 3, further comprising using the circuit design written in the second computer language to simulate and test the circuit in response to conjoined equation not being satisfiable, wherein the first computer language is a hardware description language and the second computer language is a programming language.

5. The method of claim 1, further comprising translating each bit vector equation into a SAT instance.

6. The method of claim 1, further comprising:
    forming a Boolean equation from the bit vector equations;
    converting the Boolean equation to a conjunctive normal form; and
    running a SAT procedure using the conjunctive normal form as an input.

7. The method of claim 6, wherein comparing the bit vector equations comprises determining a consistency of the bit vector equations.

8. The method of claim 6, further comprising extracting a counterexample in response to the bit vector equations being inconsistent.

9. The method of claim 6, further comprising continuing to unwind the representations to find a counterexample in response to the Boolean equation not being satisfiable from the SAT procedure.

10. The method of claim 9, further comprising terminating the method in response to a completeness threshold of a potential counterexample being exceeded.

11. The method of claim 6, further comprising extracting a counterexample in response to the Boolean equation being satisfiable from the SAT procedure.

12. The method of claim 1, further comprising repeating the method to remove any remaining inconsistencies.

13. The method of claim 1, wherein the representation of the circuit design written in the first computer language comprises a representation of the circuit design written in a hardware description language.

14. The method of claim 1, wherein the representation of the circuit design written in the second computer language comprises a representation of the circuit design written in a C type language.

15. A method to verify a circuit design, comprising:
   unwinding a representation of the circuit design written in a first computer language to form a first bit vector equation;
   unwinding another representation of the circuit design written in a second computer language to form a second bit vector equation;
   comparing the first and second bit vector equations for consistencies; and
   outputting an indication whether the first and second bit vector equations are consistent.

16. The method of claim 15, further comprising translating each bit equation into a SAT instance.

17. The method of claim 15, further comprising extracting a counterexample in response to the bit vector equations being inconsistent.

18. The method of claim 15, further comprising continuing to unwind the computer language representations in response to the bit vector equations being inconsistent.

19. The method of claim 15, wherein comparing the bit vector equations comprises translating the unwound computer language representations into a Boolean formula.

20. The method of claim 19, further comprising determining a satisfaction of the Boolean formula from a SAT procedure.

21. The method of claim 20, further comprising extracting a counterexample in response to the Boolean formula being satisfiable from the SAT procedure.

22. The method of claim 20, further comprising continuing to unwind the computer language representations to find a counterexample in response to the Boolean formula not being satisfiable from the SAT procedure.

23. The method of claim 15, further comprising terminating the method in response to a completeness threshold of a potential counterexample being exceeded.

24. The method of claim 15, further comprising repeating the method to remove inconsistencies.

25. The method of claim 15, wherein the first computer language representation is a hardware design language.

26. The method of claim 15, wherein the second computer language representation is a C type programming language.

27. A system to verify a circuit design, comprising:
   a processor adapted to unwind a representation of the circuit design written in a first computer language to form a first bit vector equation, unwind another representation of the circuit design written in a second computer language to form a second bit vector equation, and compare the first and second bit vector equations for consistencies; and
   an output device to output an indication whether the first and second bit vector equations are consistent.

28. The system of claim 27, wherein the processor is adapted to jointly unwind the first and second computer language representations of the circuit design to form a Boolean formula.

29. The system of claim 28, further comprising a SAT solver to check the satisfiability of the Boolean formula.

30. The system of claim 27, further comprising:
   means for comparing the bit vector equations for consistency.

31. The system of claim 27, wherein the first computer language representation of the circuit design comprises a hardware description language.

32. The system of claim 27, wherein the second computer language representation of the circuit design comprises a C type language.

33. A computer-readable medium having computer-executable instructions for performing a method, comprising:
   forming a first bit vector equation in response to unwinding a representation of the circuit design written in a first computer language;
   forming a second bit vector equation in response to unwinding another representation of circuit design written in a second computer language;
   comparing the bit vector equations; and
   outputting an indication whether the bit vector equations are consistent.

34. The computer-readable medium having computer-executable instructions for performing the method of claim 33, further comprising:
   jointly unwinding the first and second computer language representations of the circuit design to form a Boolean formula; and
   checking a satisfiability of the Boolean formula using a SAT procedure.

35. The computer-readable medium having computer-executable instructions for performing the method of claim 34, further comprising:
   forming a first bit vector equation in response to unwinding the first computer language representation;
   forming a second bit vector equation in response to unwinding the second computer language representation; and
   comparing the bit vector equations.

36. The computer-readable medium having computer-executable instructions for performing the method of claim 35, wherein comparing the bit vector equations comprises determining a consistency of the bit vector equations.

37. The computer-readable medium having computer-executable instructions for performing the method of claim 36, further comprising extracting a counterexample in response to the bit vector equations being consistent.

38. The computer-readable medium having computer-executable instructions for performing the method of claim 34, further comprising continuing to unwind the computer language representations to find a counterexample in response to the Boolean formula not being satisfiable.

39. The computer-readable medium having computer-executable instructions for performing the method of claim 34, further comprising extracting a counterexample in response to the Boolean formula being satisfiable.

* * * * *